(12) United States Patent
Kamineni et al.

(10) Patent No.: US 8,890,262 B2
(45) Date of Patent: Nov. 18, 2014

(54) SEMICONDUCTOR DEVICE HAVING A METAL GATE RECESS

(71) Applicant: GLOBALFOUNDRIES Inc., Grand Cayman (KY)

(72) Inventors: Vimal Kamineni, Albany, NY (US); Ruilong Xie, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/688,259

(22) Filed: Nov. 29, 2012

(65) Prior Publication Data
US 2014/0145257 A1    May 29, 2014

(51) Int. Cl.
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/00 | (2006.01) |
| H01L 29/49 | (2006.01) |
| H01L 29/40 | (2006.01) |

(52) U.S. Cl.
CPC .......... *H01L 29/4958* (2013.01); *H01L 29/401* (2013.01)
USPC ........... 257/407; 257/330; 257/331; 257/520; 257/E21.585; 257/E21.586; 257/E21.587; 257/E21.588

(58) Field of Classification Search
USPC .......... 257/330, 331, 520, E21.585, E21.586, 257/E21.587, E21.588, 407
See application file for complete search history.

(56) References Cited

U.S. PATENT DOCUMENTS

| 5,338,703 | A | | 8/1994 | Matsuoka | |
| 5,756,396 | A | * | 5/1998 | Lee et al. | 438/622 |
| 5,955,759 | A | * | 9/1999 | Ismail et al. | 257/332 |
| 6,001,420 | A | * | 12/1999 | Mosely et al. | 427/258 |
| 6,018,179 | A | * | 1/2000 | Gardner et al. | 257/336 |
| 6,265,312 | B1 | * | 7/2001 | Sidhwa et al. | 438/685 |
| 6,335,254 | B1 | * | 1/2002 | Trivedi | 438/305 |
| 6,391,769 | B1 | * | 5/2002 | Lee et al. | 438/643 |
| 6,764,884 | B1 | | 7/2004 | Yu et al. | |
| 6,765,248 | B2 | * | 7/2004 | Tobben et al. | 257/288 |
| 6,908,806 | B2 | | 6/2005 | Yang et al. | |
| 7,169,700 | B2 | * | 1/2007 | Chang et al. | 438/637 |
| 7,189,650 | B2 | * | 3/2007 | Liu et al. | 438/687 |
| 7,268,397 | B2 | | 9/2007 | Anderson et al. | |
| 7,279,774 | B2 | | 10/2007 | Seo et al. | |
| 7,320,919 | B2 | | 1/2008 | Kim | |
| 7,387,937 | B2 | | 6/2008 | Anderson et al. | |
| 7,485,574 | B2 | * | 2/2009 | Koh | 438/638 |
| 7,488,650 | B2 | | 2/2009 | Schulz | |
| 7,615,443 | B2 | | 11/2009 | Cheng et al. | |

(Continued)

*Primary Examiner* — Ida M Soward
(74) *Attorney, Agent, or Firm* — Darrell L. Pogue; Keohane & D'Alessandro, PLLC

(57) ABSTRACT

Provided is a semiconductor device (e.g., transistor such as a FinFET or planar device) having a a liner layer and a metal layer (e.g., Tungsten (W)) in a trench (e.g., via CVD and/or ALD). A single chamber (e.g., an extreme fill chamber) will be utilized to separately etch back the liner layer and the metal layer. In general, the liner layer may be etched back further than the metal layer to provide for larger contact and lower resistance. After etching is complete, a bottom-up fill/growth of metal (e.g., W) will be performed (e.g., via CVD in a W chamber or the like) to increase the presence of gate metal in the trench.

3 Claims, 3 Drawing Sheets

(56) References Cited

U.S. PATENT DOCUMENTS

| | | | |
|---|---|---|---|
| 7,655,522 B2 | 2/2010 | Kim et al. | |
| 7,659,572 B2 | 2/2010 | Kim | |
| 7,692,250 B2 | 4/2010 | Booth, Jr. et al. | |
| 7,795,688 B2 * | 9/2010 | Nagahama | 257/369 |
| 7,808,019 B2 * | 10/2010 | Lai | 257/250 |
| 7,879,660 B2 | 2/2011 | Booth, Jr. et al. | |
| 8,012,828 B2 | 9/2011 | Min et al. | |
| 8,026,176 B2 * | 9/2011 | Sakuma et al. | 438/695 |
| 8,039,876 B2 | 10/2011 | Kim et al. | |
| 8,211,769 B2 * | 7/2012 | Lee | 438/270 |
| 8,258,054 B2 * | 9/2012 | Ko | 438/597 |
| 8,536,656 B2 * | 9/2013 | Ramachandran et al. | 257/383 |
| 8,557,659 B2 * | 10/2013 | Teo et al. | 438/257 |
| 8,569,135 B2 * | 10/2013 | Guo et al. | 438/275 |
| 8,592,868 B2 * | 11/2013 | Heikman et al. | 257/194 |
| 8,614,123 B2 * | 12/2013 | Wei et al. | 438/230 |
| 8,629,511 B2 * | 1/2014 | Koburger et al. | 257/392 |
| 8,629,515 B2 * | 1/2014 | Yeh et al. | 257/412 |
| 8,722,500 B2 * | 5/2014 | Scheiper et al. | 438/299 |
| 2004/0262629 A1 * | 12/2004 | Redd et al. | 257/168 |
| 2006/0008954 A1 | 1/2006 | Kavalieros et al. | |
| 2006/0138474 A1 | 6/2006 | Yu et al. | |
| 2010/0044783 A1 * | 2/2010 | Chuang et al. | 257/328 |
| 2010/0140664 A1 * | 6/2010 | Sheppard et al. | 257/194 |
| 2010/0270627 A1 * | 10/2010 | Chang et al. | 257/411 |
| 2011/0156107 A1 * | 6/2011 | Bohr et al. | 257/288 |
| 2011/0260244 A1 | 10/2011 | Doyle et al. | |
| 2012/0001259 A1 * | 1/2012 | Chuang et al. | 257/331 |
| 2012/0094475 A1 * | 4/2012 | Tsau | 438/589 |
| 2012/0142157 A1 * | 6/2012 | Chen et al. | 438/299 |
| 2012/0146159 A1 * | 6/2012 | Wang et al. | 257/410 |
| 2012/0187504 A1 * | 7/2012 | Igarashi et al. | 257/390 |
| 2013/0241004 A1 * | 9/2013 | Yin et al. | 257/392 |
| 2014/0008720 A1 * | 1/2014 | Xie et al. | 257/331 |
| 2014/0038402 A1 * | 2/2014 | Wei et al. | 438/589 |
| 2014/0120709 A1 * | 5/2014 | Cheng et al. | 438/585 |
| 2014/0124875 A1 * | 5/2014 | Chung et al. | 257/410 |

* cited by examiner

SEMICONDUCTOR DEVICE HAVING A METAL GATE RECESS

BACKGROUND

1. Technical Field

This invention relates generally to the field of semiconductors and, more particularly, to approaches for using a low resistivity metal (e.g., tungsten (W)) in a recessed gate structure for semiconductor devices such as planar or FinFET devices.

2. Related Art

Along with other metals, Tungsten (W) is actively being explored as a possibly gate metal. In general, replacement metal gates (RMGs) are attractive due to superior T(inv)-V(t) performance. One approach is to attempt to provide a recessed gate structure. However, forming a W recess is currently an expensive process, as the process typically involves chemical mechanical polishing (CMP) and a reaction ion etch (RIE) chamber for W etching. For example, a typical approach may include a series of expensive and/or time-consuming deposition processes, CMP processes, and RIE processes. Moreover, existing techniques typically recess liner layers and gate metals evenly, which results in reduced metal contact and increased resistance.

SUMMARY

Embodiments of the present invention generally relate to approaches of forming a semiconductor device having a gate metal recess. In a typical embodiment, a liner layer and a metal layer (e.g., W) will be applied in a trench (e.g., via CVD). Then, a single chamber (e.g., an extreme fill chamber) will be utilized to separately etch back the liner layer and the metal layer. In general, the liner layer may be etched back further than the metal layer to provide for larger contact and lower resistance. After etching is complete, a bottom-up fill/growth of metal (e.g., W) will be performed (e.g., via CVD in a W chamber or the like) to increase the presence of gate metal in the trench.

A first aspect of the present invention provides a method of forming a semiconductor device having a metal gate recess, comprising: forming a liner layer within a trench of the semiconductor device; forming a metal layer over the liner layer; performing a first etch to etch at least a portion of the metal layer in the trench; performing a second etch to etch at least a portion of the liner layer; and performing a bottom-up fill of metal within the trench after the second etch to form the metal gate recess.

A second aspect of the present invention provides a method of forming a semiconductor device having a metal gate recess, comprising: depositing a liner layer over a work function metal layer within a trench of the semiconductor device; depositing a tungsten (W) layer over the liner layer; performing a first etch to etch at least a portion of the metal layer in the trench; performing a second etch to etch at least a portion of the liner layer; and performing a bottom-up growth of W within the trench after the second etch to form the metal gate recess.

A third aspect of the present invention provides a semiconductor device having a metal gate recess, comprising: a set of trenches formed over a substrate; a liner layer formed in the set of trenches; a tungsten (W) layer formed over the liner layer, the liner layer and the W layer being etched to different levels within the trench; and a bottom-up growth metal W layer formed in the set of trenches after the etching.

BRIEF DESCRIPTION OF THE DRAWINGS

These and other features of this invention will be more readily understood from the following detailed description of the various aspects of the invention taken in conjunction with the accompanying drawings in which.

DETAILED DESCRIPTION

Figure 1:
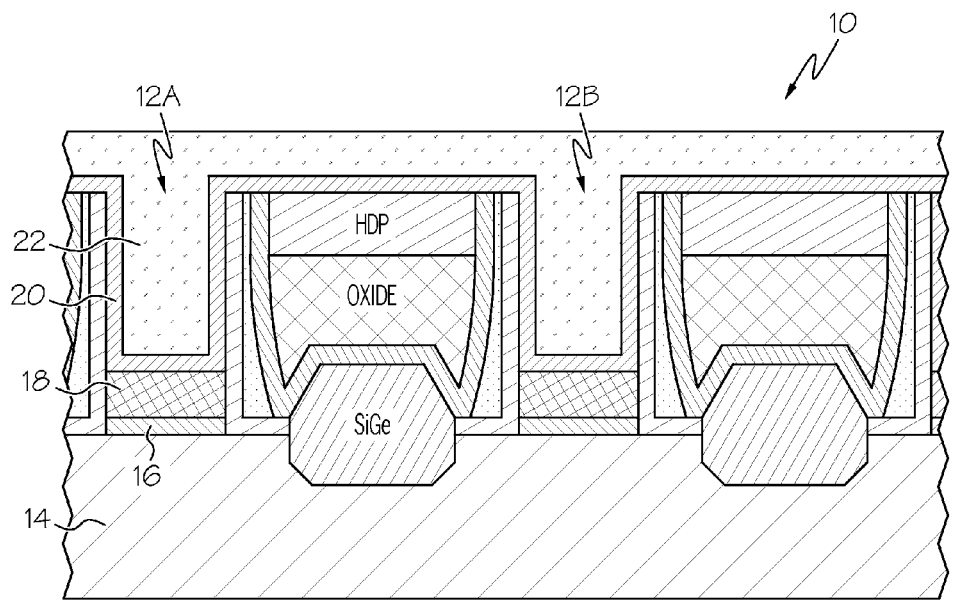
FIG. 1 shows a liner layer and metal layer being applied within a set of trenches of a semiconductor device according to an embodiment of the present invention.

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, embodiments of the present invention generally relate to approaches of forming a semiconductor device (e.g., transistor such as a FinFET or planar device) having a gate metal recess. In a typical embodiment, a liner layer and a metal layer (e.g., W) will be applied in a trench (e.g., via CVD). Then, a single chamber (e.g., an extreme fill chamber) will be utilized to separately etch back the liner layer and the metal layer. In general, the liner layer may be etched back further than the metal layer to provide for contact grams and lower resistance. After etching is complete, a bottom-up fill/growth of metal (e.g., W) will be performed (e.g., via CVD in a W chamber or the like) to increase the presence of gate metal in the trench.

Under previous approaches, W gate metals were polished using processes such as CMP and RIE. Not only were such processes expensive and time consuming, but the previous approaches resulted in uniform polishing of liner layer and metal layers within the trenches. Such a result increased device resistivity and reduced overall performance.

Referring now to FIG. 1, an initial formation stage of a semiconductor device 10 is shown. As depicted, device 10 generally comprises a set of trenches 12A-B formed over substrate 14. Each trench 12A-B generally comprises a high-k layer 16 formed (e.g., deposited via CVD) over substrate 14, a work function metal layer 18 formed (e.g., deposited via CVD) over high-k layer 16, a liner layer 20 formed (e.g., TiN deposited via CVD) over work function layer 18, and a metal layer 22 formed (e.g., W deposited via CVD) over liner layer 20. It is understood that although not specifically described, device 10 may comprise additional materials/layers such as a silicon germanium (SiGe), an oxide layer, a high density plasma (HDP) layer, etc.

Figure 2:
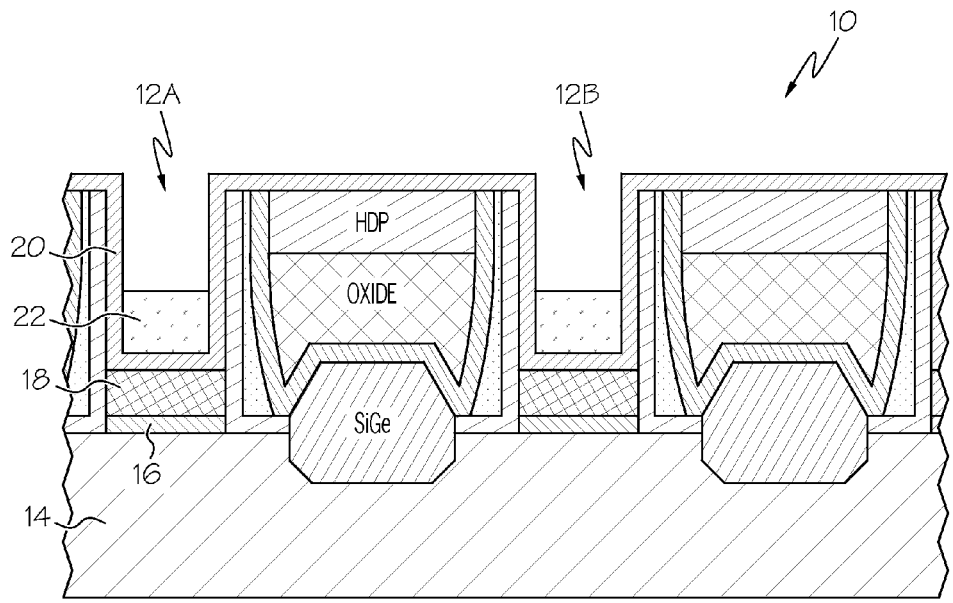
FIG. 2 shows an etching back of the metal layer shown in FIG. 1 according to an embodiment of the present invention.
Figure 3:
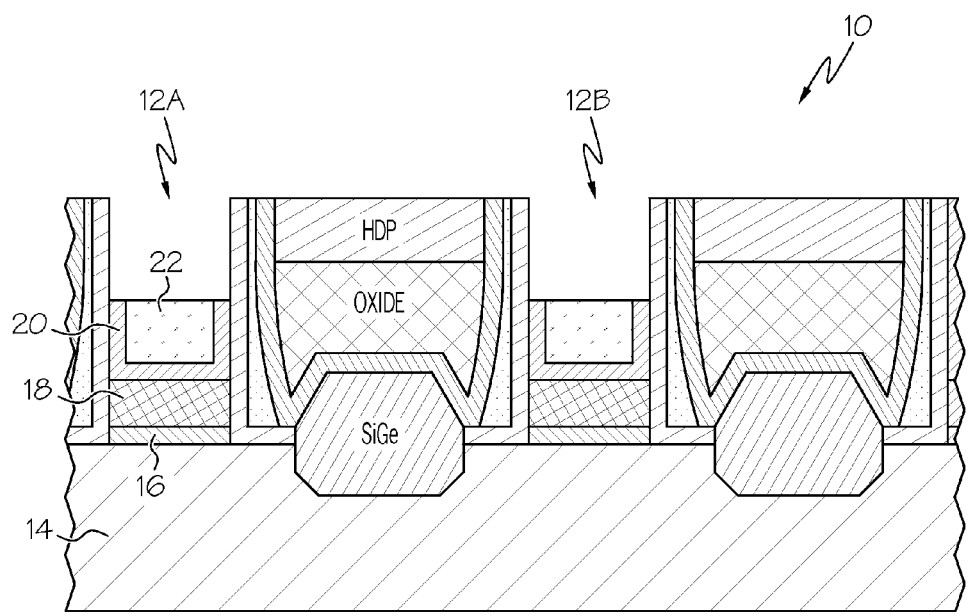
FIG. 3 shows an etching back of the liner layer of FIG. 1 according to an embodiment of the present invention.
Figure 4:
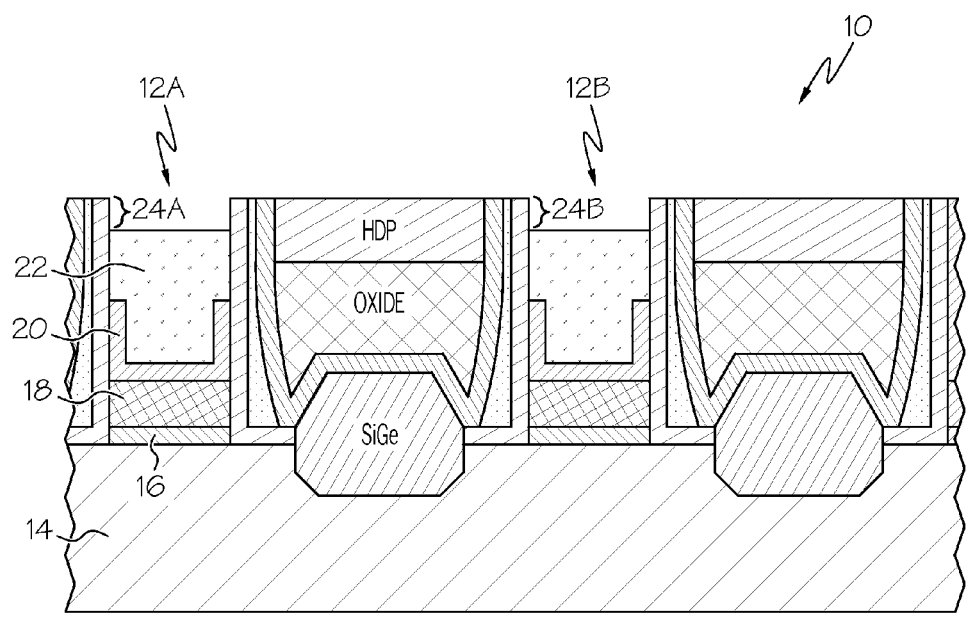
FIG. 4 shows bottom-up fill/growth of W to yield a semiconductor device having a W gate recess according to an embodiment of the present invention.

Regardless, the process is continued in FIG. 2, which shows an etching back of the metal layer 22 within trenches 12A-B. In general, the etching will be performed in an extreme fill chamber (EFX). This approximately results in a ratio of 100:1 of liner layer 20 to metal layer 22. In FIG. 3, the same EFX chamber may be used to then provide a second etch step, namely, an etching back of liner layer 20 to be approximately uniform with metal layer 22. As then shown in FIG. 4, a bottom-up fill (e.g., W growth) process is then performed (after the second etch process) to yield a metal gate recess. In a typical embodiment, the growth step is performed using W in a CVD chamber or the like. This will result in a semiconductor device having a W gate recess 24A-B in trenches 12A-B as shown in FIG. 4.

It is understood that although not specifically described, semiconductor device 10 may have additional layers and/or components such as a Silicon Germanium (SiGe) layer, a buried oxide layer, high density plasma layer, etc. In any event, among other things, the approach shown in FIGS. 1-4 allow for W fill and the recess process to occur via one tool. Moreover, W has more space for larger grains and lower resistance than previous approaches. In addition, the approach of the present invention is less costly and improves the WIP turn due to the elimination of the need to use W CMP and an RIE chamber.

Figure 5:
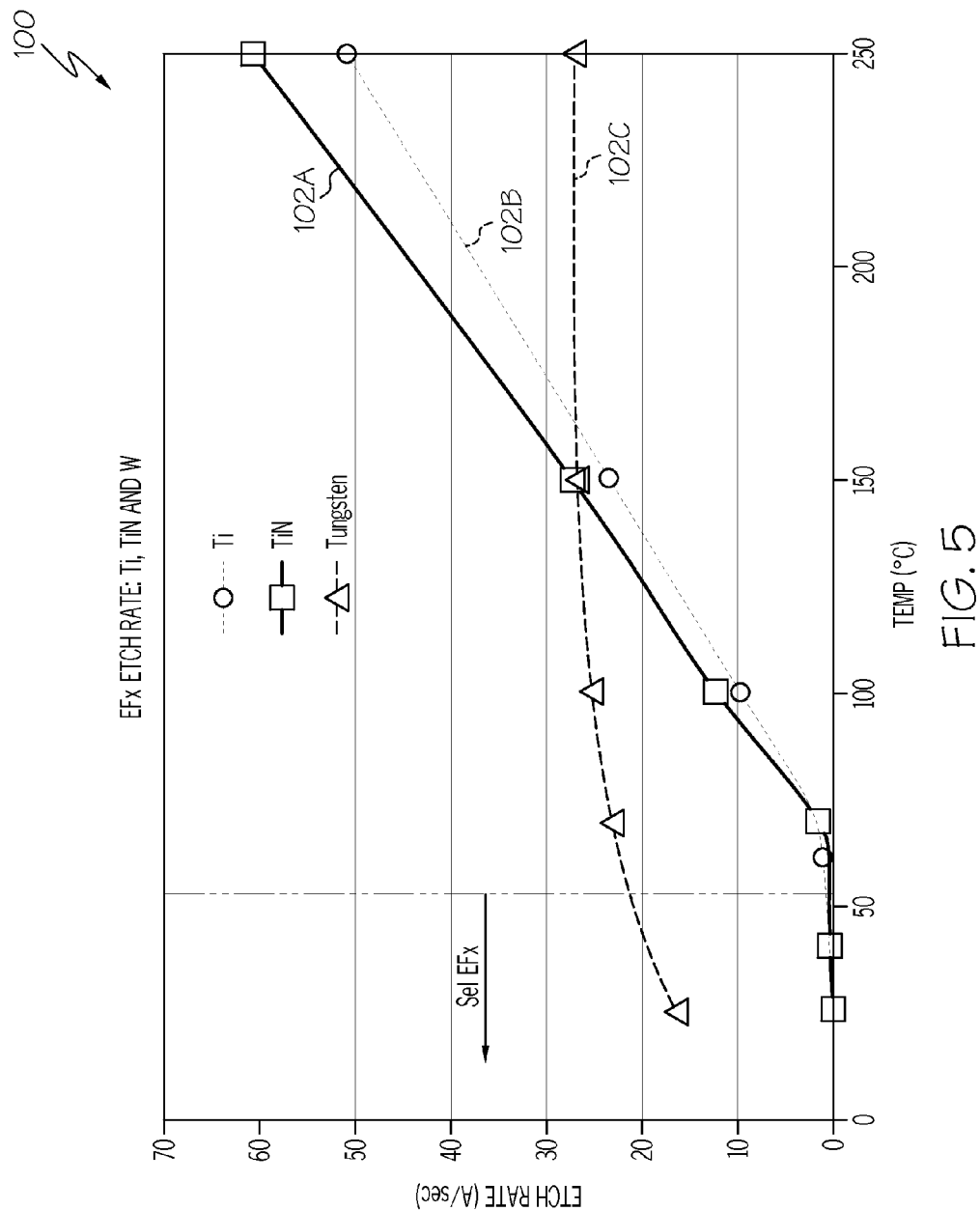
FIG. 5 shows a graph of etch rates versus temperature for various materials according to an embodiment of the present invention The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Referring now to FIG. 5, a graph 100 of etch rates versus temperature is shown. Specifically, graph 100 shows etch rates at various temperatures for TiN 102A, Ti 102B, and W 102C. As shown, W etches at the highest rate in an EFX chamber at a temperature of approximately 50° (C.), which makes it highly useable in the processes described herein. Specifically, this allows W to be selectively etched (as compared to Ti and TiN (e.g., the liner layer)) at temperatures of about 50° (C.) and lower.

In various embodiments, design tools can be provided and configured to create the data sets used to pattern the semiconductor layers as described herein. For example data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor device having a metal gate recess, comprising:
 a set of trenches formed over a substrate;
 a liner layer formed in the set of trenches, the liner layer being formed over a work function metal layer, and the work function metal layer being formed over a high k-layer that is formed over the substrate;

a tungsten (W) layer formed over the liner layer, the liner layer and the W layer being etched to different levels within the trench; and a bottom-up grown W layer formed in the set of trenches after the etching.

2. The semiconductor device of claim 1, the liner layer comprising titanium nitride (TiN).

3. The semiconductor device of claim 1, the liner layer and the W layer being etched in a single etch chamber.

\* \* \* \* \*